United States Patent
Treichel et al.

(10) Patent No.: US 6,261,407 B1
(45) Date of Patent: Jul. 17, 2001

(54) METHOD AND APPARATUS FOR REMOVAL OF THIN FILMS FROM WAFERS

(75) Inventors: Helmuth Treichel, Milpitas; Michael Ravkin, Sunnyvale; Don Anderson, Morgan Hill; John M. de Larios, Palo Alto, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/342,333

(22) Filed: Jun. 29, 1999

(51) Int. Cl.$^7$ .................................................. C23C 16/00
(52) U.S. Cl. ..................... 156/345; 118/500; 118/504; 118/728; 269/289 R
(58) Field of Search ........................... 118/728, 721, 118/504, 500; 204/298.15; 269/289 R; 156/345

(56) References Cited

U.S. PATENT DOCUMENTS

| | | | |
|---|---|---|---|
| 4,580,619 | * | 4/1986 | Aitken .................................... 165/46 |
| 5,275,422 | * | 1/1994 | Rehfeld ................................. 277/144 |
| 5,326,725 | * | 7/1994 | Sherstinsky et al. ................. 438/778 |
| 5,800,686 | * | 9/1998 | Littau et al. ..................... 204/298.07 |
| 5,925,226 | * | 7/1999 | Hurwitt et al. ................. 204/298.15 |
| 6,033,480 | * | 3/2000 | Chen et al. ........................... 118/715 |
| 6,034,863 | * | 3/2000 | Marohl et al. ....................... 361/234 |
| 6,096,135 | * | 8/2000 | Guo et al. ............................ 118/729 |
| 6,132,298 | * | 10/2000 | Zuniga et al. ....................... 451/288 |

\* cited by examiner

Primary Examiner—Jeffrie R. Lund
Assistant Examiner—Sylvia R. MacArthur
(74) Attorney, Agent, or Firm—Martine & Penilla, LLP

(57) ABSTRACT

A method and apparatus for processing a wafer are described. In one embodiment, a method for processing a wafer comprises applying a sealing mechanism to the wafer to create multiple separate, sealed portions of the wafer, and applying a plurality of different chemistries to multiple separate, sealed portions of the wafer through the sealing mechanism.

12 Claims, 5 Drawing Sheets

METHOD AND APPARATUS FOR REMOVAL OF THIN FILMS FROM WAFERS

FIELD OF THE INVENTION

The present invention relates to the field of removal of thin films from wafers; more particularly, the present invention relates to the removal of thin films (e.g., copper) from wafer bevel edges, notches and the front- and backsides of wafers and the subsequent cleaning of wafers.

BACKGROUND OF THE INVENTION

In processing semiconductor wafers, layers are often deposited on the wafer. For instance, during fabrication of some wafers, one or more copper layers are often applied to one side of a wafer (e.g., by electroplating of the front side of the wafer). When plating a wafer with copper, e.g., a layer of Tantalum Nitride is initially deposited using physical vapor deposition (PVD) to act as a barrier. After the barrier layer has been deposited, a seed copper layer is deposited using PVD or CVD. After the seed layer has been deposited, the bulk copper is deposited using PVD, plating or a combination of the two.

When applying the copper on the wafer, a problem often occurs in that the copper becomes applied onto the bevel edge, including the etch exclusion area, and/or the backside of the wafer, which may be undesirable. The presence of the copper onto the bevel edge and the backside of the wafer may cause problems in subsequent fabrication. For instance, during subsequent fabrication, some of the copper in these areas may flake off, thereby causing particulate problems and cross-contamination.

Solutions to this problem have been proposed. For example, in order to prevent deposition from occurring on the backside area of the wafer and the bevel edge area of the wafer (in some situations), a front-side clamping mechanism may be used. This front-side clamping mechanism simply includes a shadow ring. The use of a shadow ring is a simple mechanism to focus and/or direct the ions used in sputtering perpendicular to the wafer surface. Statistically, since this technique is not perfectly shadowing the ion flux, some of these ions eventually are also deposited on the regions of the wafer outside the shadow ring (e.g., the bevel edge or the edge exclusion region).

Another solution to the problem associated with the presence of copper on the bevel edge and/or backside areas is removing the unwanted copper after depositing the layer on the front side. In order to remove the copper that is located on the backside area of the wafer and bevel edge area of the wafer (in some situations) without removing any of the copper layers on the front side of the wafer, the copper on the front side of the wafer must be protected. One method of protecting the front-side (or bevel edge in particular situations) of a wafer is by adding additional lithographic steps to apply a protective resist layer over a portion of the front-side and/or beveled edge of the wafer to prevent the copper layer from being removed during the subsequent removal processes. Once the protection layer has been applied, the unwanted copper may be removed through a variety of well-known removal processes (e.g., by applying a chemistry to the copper, etc.). After the unwanted copper has been removed, then chemical film removal occurs to remove the protective layer (e.g., resist ashing). The use of the additional lithographic step followed by the chemical thin film removal and additional cleaning steps increases the cost, complication, and time to the process of putting a copper layer on the front-side of a wafer. It is desirable to avoid the added costs, complication and time associated with putting a copper layer, or any layer, on a wafer.

SUMMARY OF THE INVENTION

A method and apparatus for processing a wafer are described. In one embodiment, a method for processing a wafer comprises applying a sealing mechanism to the wafer to create multiple separate, sealed portions of the wafer, and applying a plurality of different chemistries to the separate, sealed portions of the wafer through the sealing mechanism.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A method and apparatus for processing a wafer are described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Overview

Figure 1:
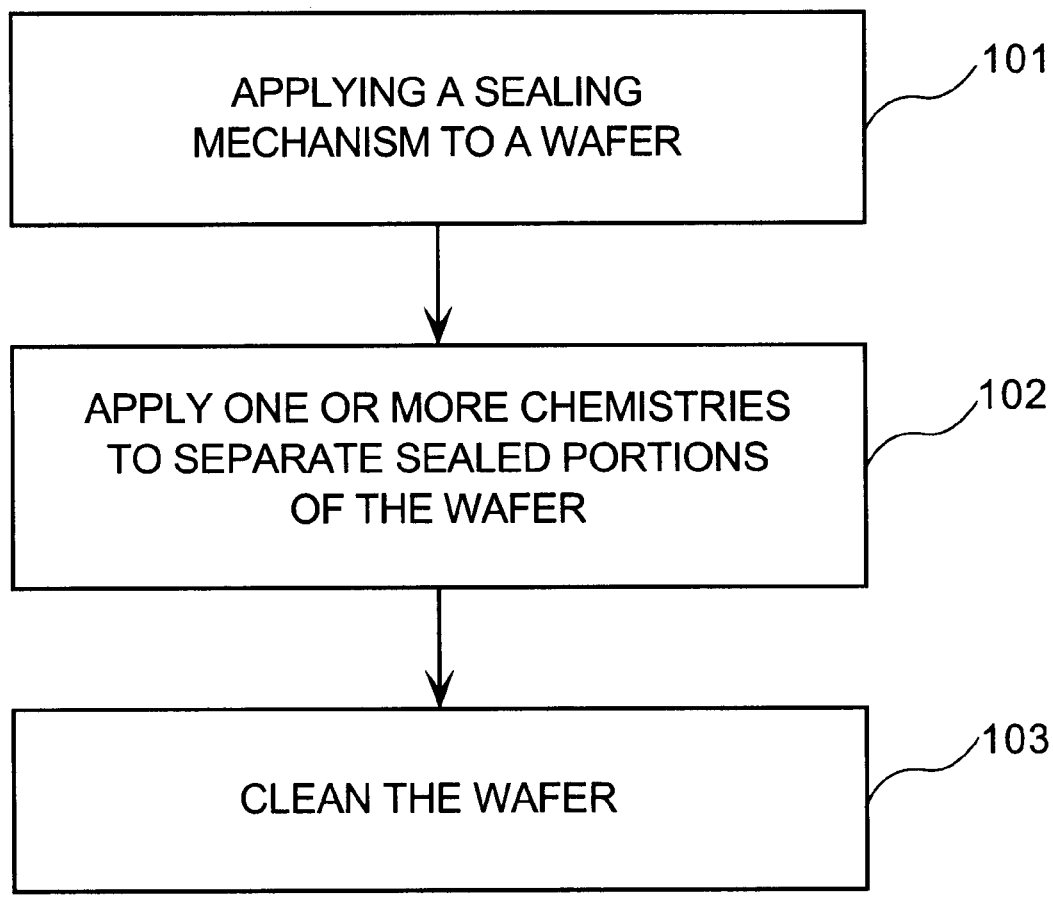
FIG. 1 is a flow chart of one embodiment of processing a wafer.

FIG. 1 illustrates one embodiment of a process for manipulating a wafer. Referring to FIG. 1, the process comprises applying a sealing mechanism to the wafer to create separate sealed portions of the wafer (processing block 101). The separate sealed portions may comprise the front-side, backside and/or bevel edge of the wafer.

After applying the sealing mechanism, the process applies chemistries to the separate sealed portions of the wafer through the sealing mechanism (processing block 102). In one embodiment, the sealing mechanism includes openings for transporting chemistries to and from a wafer surface. In one embodiment, there are at least two openings, or channels, for channeling chemical solutions to and from each of the separate sealed portions created by the sealing mechanism, one for chemistry delivery and one for chemistry removal.

The chemistries may be one or more chemical solutions that are applied to the wafer to further process the portion of the wafer to which the solution is delivered. Examples of solutions that can be used for removing Cu from the substrate surface include, but are not limited to, mixtures of nitric acid and DI Water, with ranges from 1% to 50% nitric acid, mixtures of sulfuric acid, hydrogen peroxide and DI Water, with ranges from 1% to 10% sulfuric acid and 1% to 10% hydrogen peroxide, and mixtures of ammonium hydroxide, hydrogen peroxide and DI Water, with ranges from 0.5% to 13% ammonium hydroxide and 2% to 15% hydrogen peroxide.

Chemicals for other applications may be various concentrations of hydrofluoric acid (HF) solutions, with ranges from, for example, 0.5% to 50%. Mixtures of hydrofluoric acid and nitric acid, with ranges from, for example, 0.5% to 50% HF 0.5% to 50% nitric acid. Mixtures of these chemicals as well as other chemicals can also be used and would be apparent to those skilled in the art. In one embodiment, the chemistries are applied to remove unwanted material (e.g., copper) that has deposited or is present on different portions of the wafer. For instance, using this process, chemistries may be applied to the bevel edge and backside areas of the wafer to remove unwanted copper that has been deposited or is present on those portions of the wafer while protecting that copper layer that has been deposited or plated onto the front-side of the wafer.

Once the chemistry or chemistries have been applied to the wafer, the process cleans the wafer (processing block 103). In one embodiment, the cleaning of the wafer is performed by a system separate from the one delivering chemistries to the wafer. In one embodiment, the cleaning of the wafer occurs in the same system that was used when delivering chemistries to portions of the wafer through the sealing mechanism. In one embodiment, the cleaning performed on the wafer is mechanical brush scrubbing. In alternative embodiments, chemical mechanical polishing may be performed.

In one embodiment, the differential pressure across the seal is controlled. The differential pressure across the seal in any two adjacent chambers could be controlled by the pressure regulators installed on the liquid or gas supply lines. This is done to prevent or minimize (to the extent possible) pressure differential in adjacent chambers and prevent leaks from one chamber to another.

Figure 2:
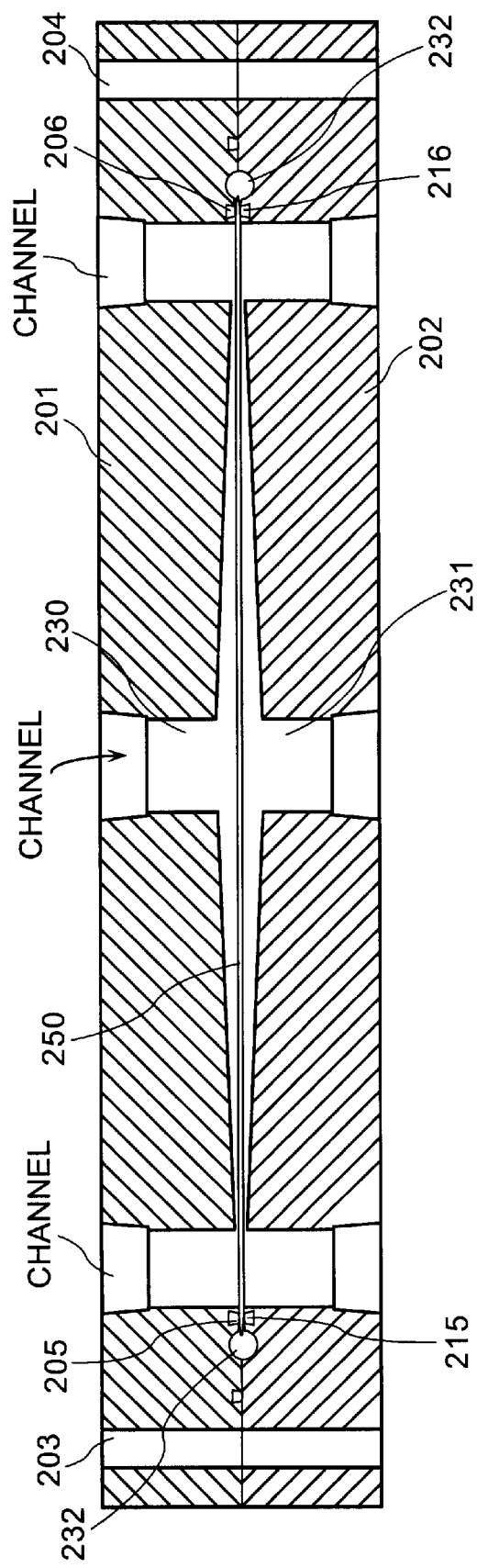
FIG. 2 illustrates a side section view of one embodiment of a sealing mechanism.

FIG. 2 illustrates a side section view of one embodiment of a sealing mechanism including a wafer. Referring to FIG. 2, the sealing mechanism comprises a top portion, or member, 201 and a bottom portion, or member, 202 that abut together with a series of one or more clamps, such as clamps 203 and 204. Other mechanisms to ensure that top portion 201 and bottom portion 202 are maintained or coupled together may be used.

Figure 3:
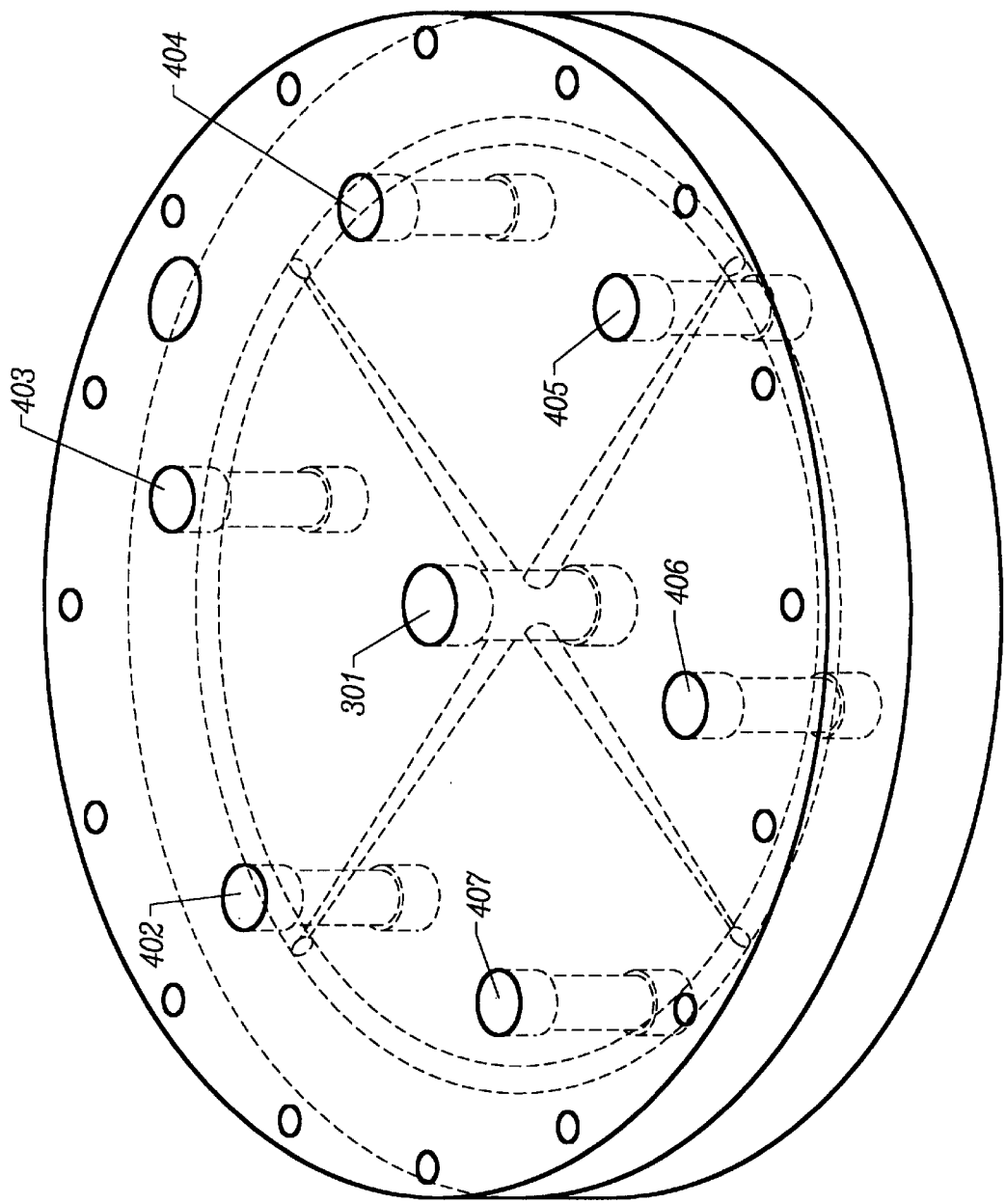
FIG. 3 illustrates a perspective view of one embodiment of a sealing mechanism.

In one embodiment, when top portion 201 and bottom portion 202 abut each other, a gap 230 exists between the top portion of the wafer 250 and top portion 201. Similarly, gap 231 exists between the bottom portion of the wafer 250 and bottom portion 202 when top portion 201 and bottom portion 202 abut each other. A third gap 232 exists around the entire bevel edge areas on the top and bottom of the wafer 250 when the first and second members abut each other around the wafer. Gap 232 fully surrounds the outer edge of the wafer 250, which is shown in FIG. 3. These gaps facilitate delivery of chemistries to portions of the wafer 250.

A seal attached to top portion 201, by way of a "v" groove, contacts the wafer 210 at points 205 and 206 when top portion 201 and bottom portion 202 are in contact. A seal similarly attached to bottom portion 202 contacts the wafer 250 at points 215 and 216 when top portion 201 and bottom portion 202 are in contact. These seals create separate sealed areas on the wafer 250.

In one embodiment, three separate sealed areas are formed when the seals contact the wafer 250 that correspond to gaps 230–232. These separate sealed areas include the front-side area 210, the backside area 211 and the bevel edge area 212. By sealing the wafer at different locations, different chemistries may be delivered to different parts of the wafer in order to remove material, while other areas of the water remain protected. For example, where copper is present on the bevel edge or around the backside of the wafer, the separate sealed portions of the wafer allow chemistries to be delivered to the bevel edge and backside of the wafer to remove the copper without removing the copper layer on the front-side of the wafer.

Note that the seal is selected based on the chemistry. That is, the seal must hold to allow the appropriate chemistry to remove a particular layer. In one embodiment, to remove the copper layer, the seal is a polymer based on Teflon. In one embodiment, this polymer has a chlorine component for water resistance and flexibility. In one embodiment, such a seal is made out of CALREZ. In an alternative embodiment, the seal comprises CHEMRAZ. Also note that the seals attached to the top portion 201 and the bottom portion 202 are circular. This is not a requirement in that any shape or shapes may be used depending on which portions of the wafer are to be sealed.

Figure 4:
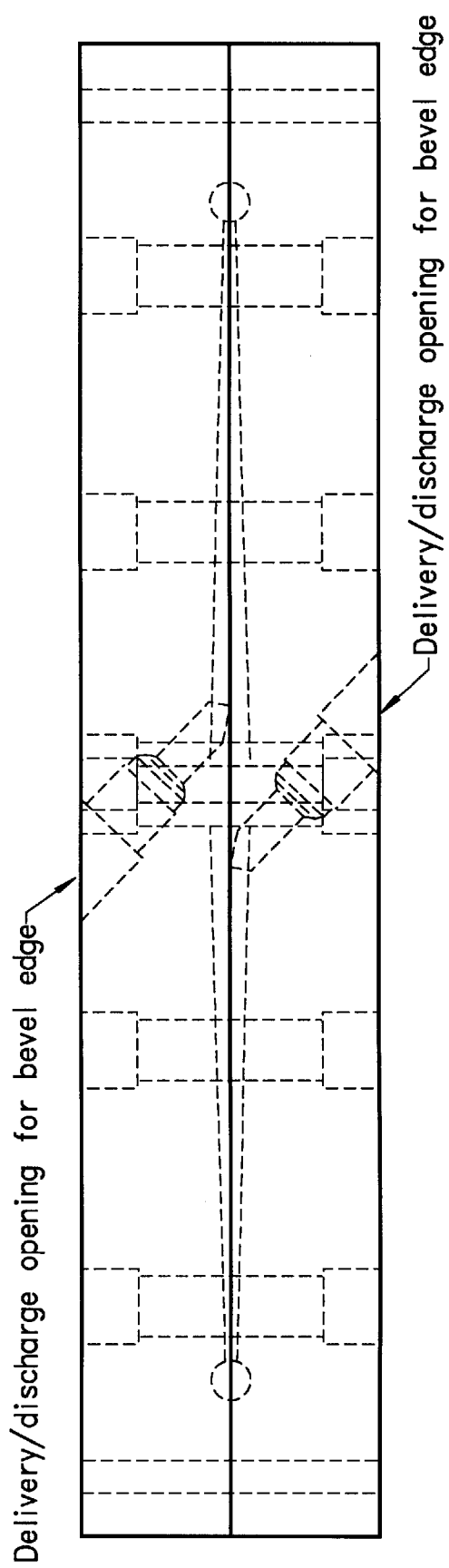
FIG. 4 illustrates a side view illustrating the chemical delivery system to the bevel edge area of a wafer.

Once the seal is applied and the individual regions are isolated, different chemistries may be delivered to the different wafer surfaces using a multiplicity of holes, openings, or channels, in the top portion 201 and bottom portion 202 of the sealing mechanism. In one embodiment, these channels or openings allow the chemistries to be delivered to the three separate sealed areas of the wafer simultaneously and independently of each other. For example, the sealed portion over the front-side of the wafer may include one hole to supply the chemistry and one or more holes to allow the chemistry to exit the sealed area. Similarly, the backside may have the same arrangement. FIG. 3 illustrates a perspective view of the topside of one embodiment of the sealing mechanism showing a central hole 301 that allows chemistries to be delivered to the front-side of the wafer and holes 402–407 which allow for discharging or removing the fluid from inside the sealed area. FIG. 4 illustrates the side section view of the seal showing a chemical delivery and discharge areas to supply and remove chemistry from the bevel edge sealed area around the wafer. Delivery a chemistry to one or more of openings may be accomplished in a manner well-known in the art.

It should be noted that other ways might be used to deliver chemistry. In one embodiment, the delivery method is selected to optimize flow, or otherwise control the flow. That is, the manner in which chemistries are delivered may create a flow pattern for uniform removal of a particular film or layer on the wafer.

In one embodiment, the differential pressure across individually sealed portions may be controlled. That is, by applying a vacuum to a portion of the seal, the two or more of the portions originally separated by the seal may form a single region to which chemistries may be delivered for cleaning.

The application of the chemistry insures removal of thin films (e.g., copper) from the bevel edge, including the notch areas, and wafer front and backsides without additional process steps (e.g., lithographic front-side protection). Also the system method described above allowed for post cleaning in the same system simultaneously and/or subsequently. The solution is efficient and simple with reduced costs and improved yield.

Figure 5:
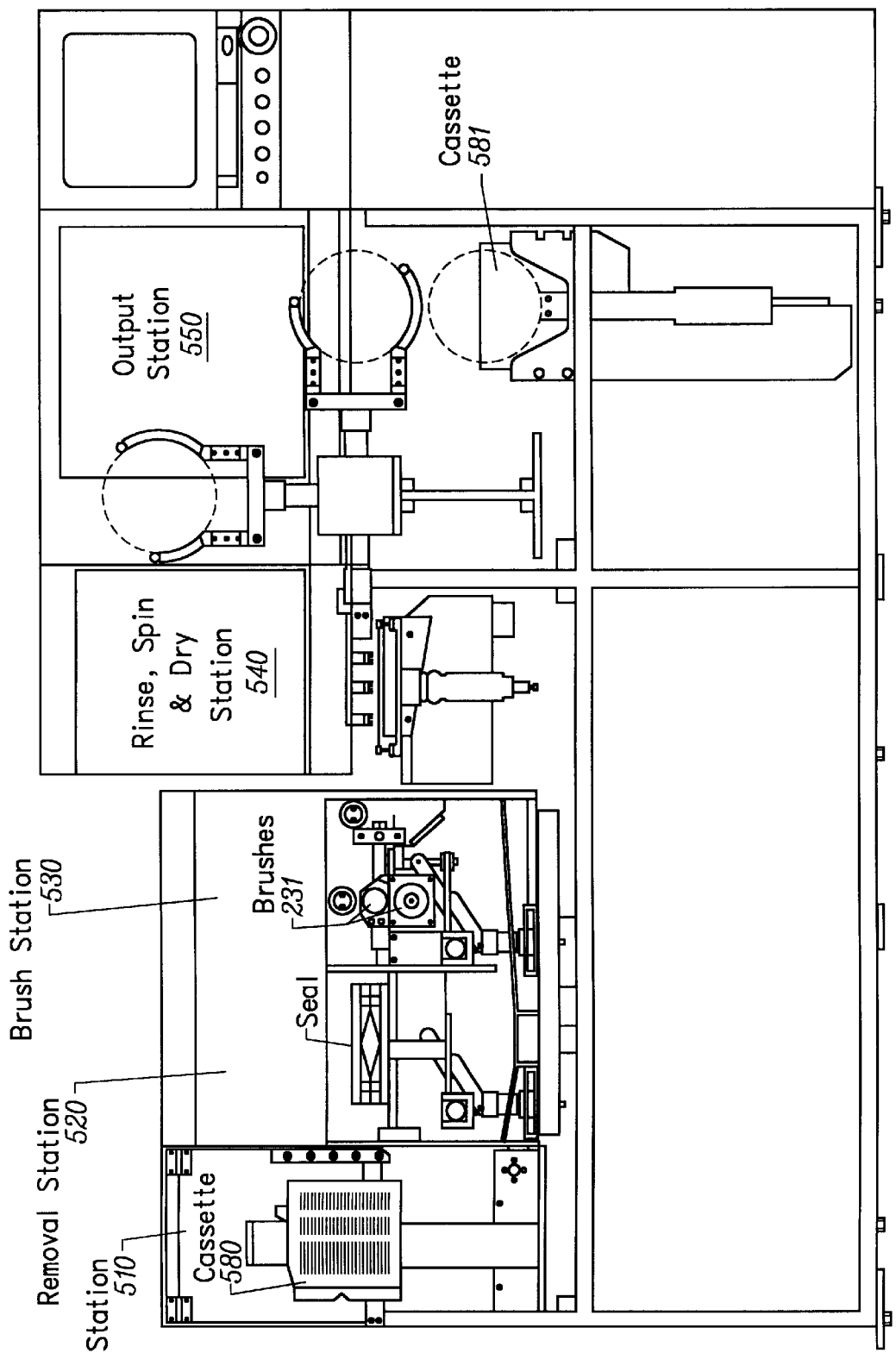
FIG. 5 is a block diagram of one embodiment of a scrubber system.

The seal mechanism may be included as part of a cleaning or other wafer processing system, such as shown in FIG. 5. In an alternative embodiment, the sealing mechanism may be a part of the stand-alone device. Such a stand-alone device may have a rinsing capability and one or more dryers.

Overview of the Scrubbing Process

As an example, and not by limitation, the present invention is described in conjunction with a scrubbing process, more specifically, a scrubbing process in which one or more sides of the wafer are scrubbed (e.g., front and back-sides of a wafer). The scrubber includes a number of stations. Each of these stations represents one or more steps in the process. Substrates are loaded at one end of the system, the sealing mechanism applied, chemistries delivered to remove unwanted deposited material, wafers are cleaned and dried substrates, and then unloaded from the other end of the system. An example of a system of this type is the Synergy™ scrubber available from Lam Research Corporation, Fremont, Calif., which is modified to incorporate the sealing mechanism into one or more of the stations.

FIG. 5 represents a cross sectional view of a Synergy™ configuration (system) with the incorporated sealing mechanism. Usually, the wafers are delivered to the system after chemical deposition. At the start of the process wafers are loaded into a wafer cassette 280 (cassette) and the cassette 280 is then placed into the station 210. In one embodiment, station 210 is designed to prevent further oxidation on wafers having exposed copper layers. After cassette 280 is placed into station 210, the wafers are automatically removed from the cassette 280 and placed, one at a time, into the thin film removal station 220.

In the thin film removal station 220, one or more solutions are delivered through the sealing mechanism to one or more of the wafer surfaces to remove thin films. The solutions are delivered to and removed from the openings in the sealing mechanism in a manner well known in the art.

The wafer is then automatically removed from the thin film removal station 220 and placed into the brush station 230. In the brush station 230, the substrate is processed through a scrubbing operation. In one embodiment, the substrate is treated with an ammonia solution. In one embodiment, the cleaning solution is applied to the substrate through brushes 231.

After wafer scrubbing has been completed, the wafer is then automatically removed from the brush station 230 and placed into the rinse, spin and dry station 240. Rinse, spin, and dry station 240 rinses, spins, and dries the wafer. At this point the wafer has been cleaned.

Once the rinse, spin, and dry steps have been completed, the wafer is then transported from the rinse, spin, and dry station 240 to the output station 250 where the wafer is placed into cassette 281. The transfer is usually carried out by a robotic arm, which lifts the wafer out of the rinse, spin, and dry station 240 by its edges and places it into the cassette 281. The cassette is then transferred to storage or to another cleaning or processing system.

It will be apparent to one of ordinary skill in the art that some of the steps in the system described above may occur in another order or with different solutions other than as presented. For example, different solutions, such as water, citric acid, ammonium hydroxide, and ammonium citrate, not limited to the cited examples, (or mixtures of solutions) may be used in place of the proprietary cleaning solution in one of the stations.

While the following description illustrates the use of the present invention in a cleaning system in which both sides of the substrate are scrubbed, the present invention may be used in other systems and processes, cleaning or otherwise.

The present invention may be employed in a number of substrate cleaning procedures. Although the present invention is described in conjunction with the scrubbing of a wafer, it will be appreciated that any similarly shaped, i.e. generally flat substrate, and may be processed by the methods and apparatus of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) device, or substrates for processing other apparatus and devices such as flat panel displays, multichip modules, etc. However, to avoid obscuring the invention the following description will describe wafer cleaning in general and as an example of one embodiment will describe the use of the present invention in a scrubbing process.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in them recite only those features regarded as essential to the invention.

We claim:

1. An apparatus for sealing a wafer comprising:
   a first member with a first seal attached thereto;
   a second member with a second seal attached thereto, wherein the first and second seals contact the wafer when the first and second members abut each other to form three separate, sealed areas; and
   a plurality of openings in each of an upper and lower portions to permit a plurality of chemistries to be delivered to the three separate, sealed areas of the wafer simultaneously and independently of each other.

2. The apparatus defined in claim 1 wherein the first member has a first recessed portion so that a first gap exists between a portion of the wafer and the first member when the first and second members abut each other around the wafer.

3. The apparatus defined in claim 2 wherein the second member has a second recessed portion so that a gap exists between a portion of the wafer and the second member when the first and second members abut each other around the wafer.

4. The apparatus defined in claims 1 wherein the first and second member include a recessed portion so that a gap exists around the bevel edge areas on the top and bottom of a wafer when the first and second members abut each other around the wafer.

5. The apparatus defined in claim 1 further comprising a clamping mechanism to clamp the first and second members together.

6. The apparatus defined in claim 1 wherein the first and second seals include a polymer with a chlorine component.

7. A system for processing a wafer comprising:
   a station;
   a sealing mechanism disposed within the station and having
      a first member with a first seal attached thereto,
      a second member with a second seal attached thereto, wherein the first and second seals contact the wafer when the first and second members abut each other to form three separate sealed areas, and
      a plurality of openings in each of an upper and lower portions to permit a plurality of chemistries to be delivered to the three separate sealed areas of the wafer simultaneously and independently of each other; and a chemistry delivery system coupled to the plurality of openings to delivery the plurality of chemistries to the plurality of openings.

8. The apparatus defined in claim 7 wherein the first member has a first recessed portion so that a first gap exists between a portion of the wafer and the first member when the first and second members abut each other around the wafer.

9. The apparatus defined in claim 8 wherein the second member has a second recessed portion so that a gap exists between a portion of the wafer and the second member when the first and second members abut each other around the wafer.

10. The apparatus defined in claim 7 wherein the first and second member include a recessed portion so that a gap exists around the bevel edge areas on the top and bottom of a wafer when the first and second members abut each other around the wafer.

11. The apparatus defined in claim 7 further comprising a clamping mechanism to clamp the first and second members together.

12. The apparatus defined in claim 7 wherein the first and second seals include a polymer with a chlorine component.

* * * * *